United States Patent [19]

Boesen

[11] 4,375,157

[45] Mar. 1, 1983

[54] DOWNHOLE THERMOELECTRIC REFRIGERATOR

[75] Inventor: George F. Boesen, Park Ridge, Ill.

[73] Assignee: Borg-Warner Corporation, Chicago, Ill.

[21] Appl. No.: 333,609

[22] Filed: Dec. 23, 1981

[51] Int. Cl.³ .............................................. F25B 19/00
[52] U.S. Cl. ........................................ 62/514 R; 62/3;
  62/260; 165/45; 165/104.21
[58] Field of Search .......................... 62/260, 514 R, 3;
  165/45, 104.21; 250/261

[56] References Cited

U.S. PATENT DOCUMENTS 3,666,566  5/1972  Paine ................................... 136/202
3,702,932  11/1972 Tanner et al. ...................... 62/514 R
4,199,953  4/1980  Richter, Jr. et al. ...................... 62/3

Primary Examiner—Ronald C. Capossela
Attorney, Agent, or Firm—James E. Tracy

[57] ABSTRACT

Cooling of electronic components, positioned downhole in a high temperature environment in a deep well, is achieved by a thermoelectric cooling system within a long vacuum insulated dewar flask which encompasses the electronic components and the cooling system. The electronic components are directly mounted on the cold plate of the cooling system and will be cooled down to a temperature well below the downhole ambient temperature. A long vapor phase heat transfer pipe and a heat exchanger, which is connected to the pipe's upper end and is immersed in the well fluid, convey heat from the hot plate of the cooling system to the fluid and to the downhole environment which will function as a heat sink, the hot plate temperature being greater than the ambient temperature.

6 Claims, 1 Drawing Figure

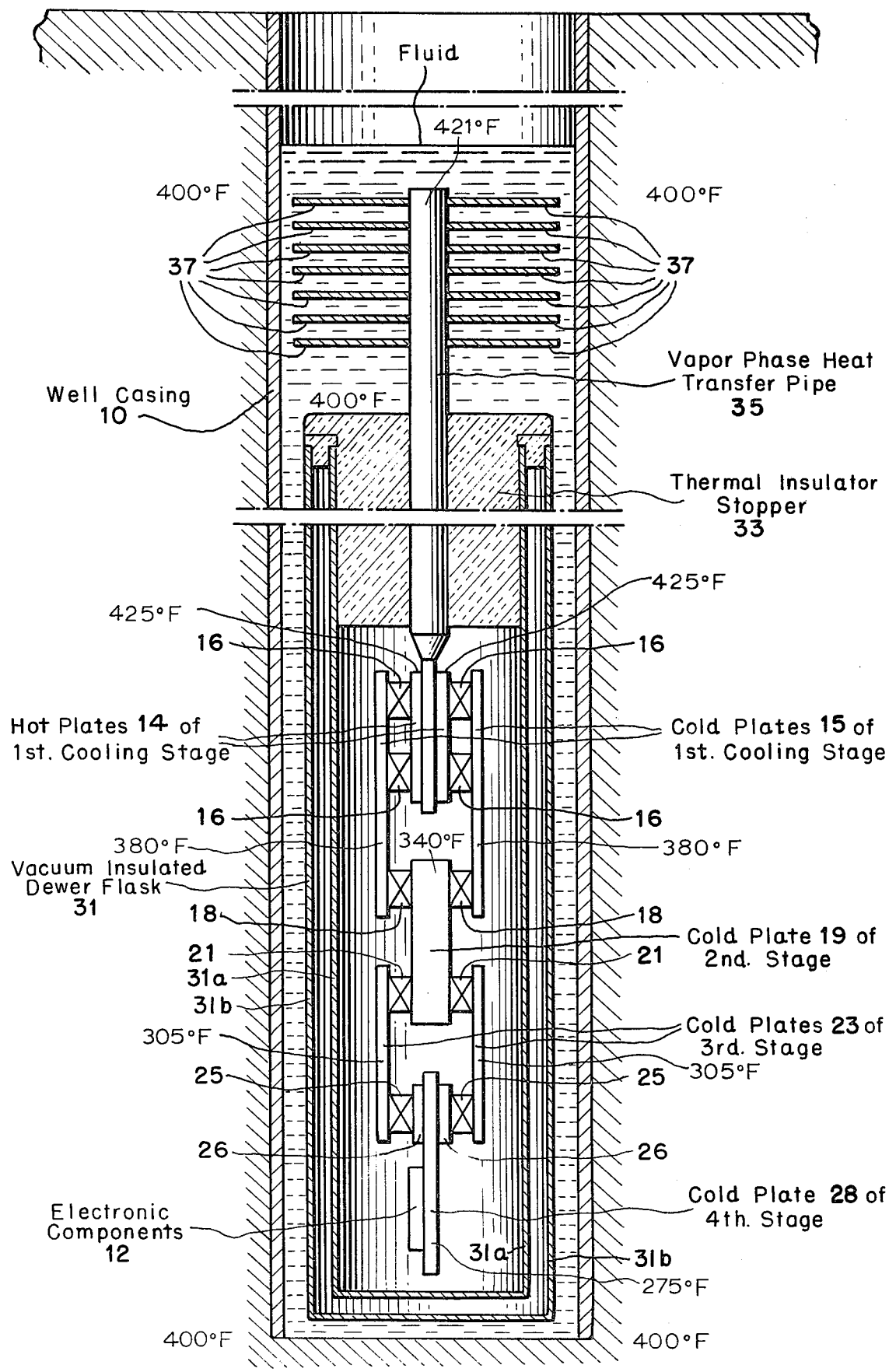

DOWNHOLE THERMOELECTRIC REFRIGERATOR

BACKGROUND OF THE INVENTION

This invention relates to a thermoelectric refrigerating system for cooling electronic components located downhole in a deep well where the ambient temperatures are normally too high for proper operation of those components.

Electronic components, including instrumentation, are employed for measuring or logging various parameters and conditions downhole is deep wells, such as oil wells and geothermal wells which may have depths of over 10,000 feet. Extremely high ambient temperatures are usually encountered in those deep wells and unless the electronic components are cooled in some manner, proper operation thereof will not be obtained. In accordance with one previous arrangement for achieving cooling of electronic instrumentation in a deep well to monitor downhole conditions, a precooled large block of copper is placed in a vacuum insulated dewar flask (which is smaller to a thermos bottle) along with the electronic components and the dewar flask is then lowered downhole into the deep well to the level where the measurements are desired. For a limited time, generally about one-half hour, the pre-cooled copper block will maintain the temperature of the electronic components sufficiently low to permit the instruments to operate as required to measure the sensed downhole conditions. After the high ambient temperature heats up the copper block, the electronic components will no longer function properly and may even burn up and be destroyed by the high temperature environment.

In contrast, the uniquely constructed downhole thermoelectric refrigerator of the present invention ensures that the downhole electronic components will be cooled continuously and will operate properly as long as desired. Well monitoring or logging can be maintained at all times and the instrumentation will never be destroyed by the high ambient temperatures that exist downhole. Moreover, the invention features a novel thermoelectric cooler configuration which provides an expandable single stage or a multi-stage thermoelectric cooling system.

SUMMARY OF THE INVENTION

The downhole thermoelectric refrigerator of the present invention provides cooling for electronic components located downhole in a high ambient temperature environment in a deep well containing well fluid. The refrigerator comprises a thermoelectric cooling system, positioned downhole in the deep well, having a hot plate and a cold plate and having at least one cooling stage, the cold plate serving as a mounting support for the electronic components to be cooled. There is a vapor phase heat transfer pipe extending along the axis of the well, the lower end of the pipe being thermally connected to the hot plate of the thermoelectric cooling system. A vacuum insulated dewar flask, extending along the axis of the well, has a closed lower end and surrounds the thermoelectric cooling system, the electronic components and a major portion of the heat transfer pipe. A thermal insulator stopper is inserted in the open upper end of the dewar flask, the heat transfer pipe extending through the stopper so that an upper minor portion of the pipe is positioned above the stopper and is outside of the enclosure formed by the dewar flask and the stopper. The refrigerator also includes heat exchanger means, such as heat conducting fins, thermally connected to the upper portion of the heat transfer pipe and communicating with the well fluid in order to conduct heat from the pipe to the well fluid and thus to the downhole environment. With this arrangement, heat is pumped uphill against the temperature gradient by the thermoelectric cooling system, thereby cooling the electronic components, from a relatively low temperature on the cold plate, which low temperature is substantially less than the high ambient temperature in the downhole environment, to a relatively high temperature on the hot plate, which high temperature is greater than the ambient temperature, heat thereby being transferred by the heat transfer pipe with relatively little temperature loss from the hot plate and from the pipe's lower end to the pipe's upper end, from which upper end the heat exchanger means transfers heat downhill with the temperature gradient to the well fluid and to the downhole environment which are established at the ambient temperature and have an infinite heat capacity, thereby functioning as a heat sink.

DESCRIPTION OF THE DRAWING

The features of the invention which are believed to be novel are set forth with particularity in the appended claims. The invention may best be understood, however, by reference to the following description in conjunction with the accompanying drawing which schematically illustrates, partially in section, a downhole thermoelectric refrigerator constructed in accordance with the invention and installed at the bottom of a deep well to cool electronic components in the high temperature environment usually found at that deep location.

DESCRIPTION OF THE PREFERRED EMBODIMENT

The illustrated deep well is provided with a well casing 10 which is a cylindrical metal tube or shell and is usually surrounded by cement. The electronic components to be cooled may include instrumentation for sensing various downhole conditions and these components are positioned near the bottom of the well as schematically illustrated by the block 12. Of course, the electronic components could be positioned at any depth or level in the well where a measurement is desired. The deeper the level, the hotter the environment. As will be made apparent, electronic components 12 are directly mounted on a portion of the thermoelectric cooling system.

The thermoelectric cooling system employed in the invention may comprise only a single cooling stage having a hot plate and a cold plate. Preferably, however, the cooling system is provided with several thermoelectric cooling stages connected in series or cascade with the cold side of each stage being thermally connected to the hot side of the next stage. In this way, the cooling requirements on each stage are minimized. In the embodiment illustrated four cooling stages are utilized, the first cooling stage comprising a pair of hot plates 14, a pair of cold plates 15 and four thermoelectric cooling modules 16, each having a large number of thermocouples. Each module 16, and each of the other module incorporated in the thermoelectric cooling system, is of conventional construction and no further details need be shown. It should be mentioned, however, that the thermoelectric cooling modules should be fabricated with solders capable of withstanding the high temperature environment of downhole applications.

Cold plates 15 also serve or function as the hot plates of the second cooling stage since those plates are thermally connected to the hot sides of thermoelectric modules 18, the cold sides of which are connected to cold plate 19. In similar fashion, cold plate 19 of the second stage doubles as the hot plate of the third stage inasmuch as it is connected to the hot sides of thermoelectric cooling modules 21. The cold sides of modules 21 connect to cold plates 23 which in turn function as the hot plates of the fourth cooling stage, cold plates 23 being thermally connected to the hot sides of thermoelectric modules 25. The cold sides of modules 25 thermally connect, via a pair of coupling plates 26, to cold plate 28 on which the electronic components 12 are mounted and supported.

The multistage thermoelectric cooling system therefore effectively has a cold plate 28 and a hot plate 14, heat being pumped by the cooling system from plate 28 to plate 14 uphill against the temperature gradient, namely from a lower to a higher temperature.

In order to maximize the isolation of the electronic components 12 from the high temperature downhole environment, thereby minimizing the thermal load and thus the cooling requirements imposed on the thermoelectric cooling system, the electronic components and the cooling system are surrounded by, and are positioned close to the bottom of, a long vacuum insulated dewar flask 31 which extends along the axis of the deep well and has a closed lower end. Dewar flask 31 includes an inner shell or tube 31a and a concentric outer tube or shell 31b, both of which are preferably made of thin stainless steel strong enough to maintain a complete vacuum between the inner and outer tubes while avoiding denting. The thickness of inner tube 31a in particular should be small to minimize axial thermal conduction from the top or open end of the dewar flask 31 and down to the vicinity of the electronic components. Radial thermal conduction from the outer tube to the inner tube will be minimized by the very high thermal resistance presented by the vacuum between the tubes. Axial thermal conduction from the top of dewar flask 31 is further minimized by extending the length of the flask as long as possible. The longer, the better. For example, a typical deep well may have an inside diameter of less than five inches. By making the dewar flask at least three feet long, the thermal resistance from the upper end of inner tube 31a, and down along its length dimension, will be sufficiently high to provide excellent thermal isolation for the electronic components 12 from the high temperature environment outside of the dewar flask.

Of course, thermal insulator stopper 33, inserted in the open upper end of dewar flask 31, should be fabricated of material, such as glass foam, having very low thermal conductivity and should be made as long as possible, preferably extending all the way down to a level slightly above the thermoelectric cooling system. In this way, the open end of flask 31 will be well sealed and insulated from the environment external to the flask.

The heat removed by the thermoelectric cooling system, in order to maintain the electronic components 12 at an appropriate low temperature well below the high ambient temperature of the well fluid and the downhole environment outside of the dewar flask 31, must be pumped to that well fluid and downhole environment which have infinite heat capacity. To achieve the required heat pumping, the thermoelectric cooling system must have adequate cooling capacity to establish cold plate 28 at the desired low temperature necessary to cool the electronic components, while at the same time establishing hot plates 14 at a temperature which is higher than the ambient temperature. As indicated earlier, the thermoelectric cooling system pumps heat uphill, against the temperature gradient, from a relatively low temperature on cold plate 28 to a relatively high temperature on each hot plate 14. The hot plate temperature must be higher than the ambient temperature so that heat may then flow downhill, with the temperature gradient, to the well fluid and thus to the downhole environment. However, the hot plate temperature should only be as high as necessary to conduct heat to the well fluid. A hot plate temperature which is too high means that the cooling capacity of the cooling system must be greater than needed. The temperature difference created by the cooling system should only be as high as necessary to properly cool the electronic components, thereby minimizing the cooling requirements placed on the cooling system and minimizing the cooling system's size, power requirements and cost.

In accordance with a salient feature of the invention, the temperature on hot plates 14 need only be slightly greater than the high ambient temperature of the well fluid and downhole environment. This is accomplished by employing vapor phase heat transfer pipe 35 to transfer heat, with relatively little temperature loss and with a small cross-sectional area, from hot plates 14 and upward through stopper 33 and through the long dewar flask 31 to the environment outside. The major portion of heat pipe 35 is therefore positioned within dewar flask 31 and stopper 33. As is well known, a vapor phase heat transfer pipe is a closed evacuated tube containing a capillary-wick structure and a small amount of a vaporizable fluid, such as water. The tube employs a boiling-condensing cycle. When heat is applied to one end (the heat-input end) of the tube, the fluid boils and the heat is absorbed by the fluid as latent heat of vaporization. The vapor rises and condenses at the other end to give up latent heat of condensation which is then usually transferred to a heat sink. The condensed liquid returns to the heat-input end of the tube via the capillary action of the wick structure. The vapor pressure drop from one end to the other is very small, as a result of which the boiling-condensing cycle is essentially an isothermal process. The temperature loss from the heat source to the heat sink will therefore be very small, even though the heat may be transferred over a relatively long distance. The amount of heat that can be transferred by a heat pipe is usually several orders of magnitude larger than can be transported by means of solid metal, such as copper, having the same cross-sectional area. Moreover, the heat pipe is a relatively lightweight structure compared to a solid core.

In the present invention, the lower end, which of course is the heat-input end, of heat transfer pipe 35 extends below stopper 33 and thermally connects to hot plates 14. The upper end and an upper minor portion of pipe 35 extend above stopper 33 and heat exchanger means, in the form of a series of heat conducting fins 37, thermally connects to that upper portion and communicates with, namely contacts, the well fluid in order to conduct heat from the pipe to the well fluid and thus to the downhole environment. The well fluid and downhole environment will constitute a heat sink, having infinite heat capacity, for the upper end of heat transfer pipe 35.

In order to more completely understand the operation of the invention, typical temperature readings at various locations have been added to the drawing. In the example illustrated, the downhole ambient temperature is about 400° Fahrenheit (or F.) and this high temperature will be found in the entire downhole environment shown and will be the temperature of the well fluid surrounding the enclosure formed by the dewar flask 31 and stopper 33. With the thermal isolation provided by the dewar flask and stopper, the four-stage cooling system will be capable of cooling cold plate 28, and consequently the electronic components 12, down to about 275° F. By continuously maintaining that temperature, which is relatively low compared to the 400° F. ambient temperature, the electronic components will operate in normal fashion and will effect the desired monitoring.

The cooling system pumps heat uphill, against the temperature gradient, from the relatively low 275° F. temperature on cold plate 28 to the relatively high temperature 425° F. on hot plates 14, which high temperature, it will be noted, is higher than the 400° F. ambient temperature. This is necessary so that heat will flow from hot plates 14 to the well fluid and to the downhole environment. By employing four series-connected cooling stages, the heat removing or heat pumping capacity of each stage need only be large enough to create a portion of the total temperature differential from 275° F. to 425° F. More particularly, the first stage is capable of establishing its cold plates 15 at 380° F., which is then reduced by the second stage to 340° F. on cold plate 19. A further temperature reduction is accomplished by the third stage to 305° F. on cold plates 23, after which the temperature is dropped by the fourth stage to 275° F. With this arrangement, no cooling stage must be sized to create a temperature difference greater than 45° F., while a total temperature difference of 150° F. is achieved by the entire cooling system.

By employing the vapor phase heat transfer pipe 35, the 425° F. heat on hot plates 14 is conveyed, with relatively little heat loss, up through the long dewar flask 31 and long stopper 33 to well fluid in the space above the stopper. Over that long distance the temperature will only drop about 4° F. Hence, the temperature will be about 421° F. where the heat exchanger means, namely the heat conducting fins 37, thermally connect to the upper end of heat transfer pipe 35. The fins function as a heat exchanger since they will transfer the 421° F. heat downhill, with the temperature gradient, to the well fluid and to the downhole environment which are established at the 400° F. ambient temperature. The greater the fin surface area in contact with the well fluid, the lower the temperature drop for a given heat flow. The heat removed by the cooling system thus flows through heat pipe 35 and the heat exchanger means 37 to the heat sink provided by the infinite heat capacity of the fluid and the downhill environment.

Of course, wire conductors would be connected from the surface of the deep well and down through the well and through stopper 33 in order to electrically couple the electronic components 12 to appropriate surface equipment for supplying power to the electronic components and for utilizing the information signals produced by the electronic components. Such wire conductors have not been shown to avoid unduly encumbering the drawing.

The invention therefore provides, for a deep well, a unique downhole thermoelectric refrigerator which thermally isolates, by means of a long dewar flask, downhole electronic components from the environment, the electronic components being cooled within the dewar flask by a multi-stage thermoelectric cooling system. The heat removed by the cooling system is transferred, with very little heat loss, from the hot plate of the cooling system and up through the long dewar flask by means of a vapor phase heat transfer pipe, heat then flowing from the top of the heat pipe to the well fluid and to the downhole environment.

While a particular embodiment of the invention has been shown and described, modifications may be made and it is intended in the appended claims to cover all such modifications as may fall within the true spirit and scope of the invention.

I claim:

1. A downhole thermoelectric refrigerator for cooling electronic components located downhole in a high ambient temperature environment in a deep well containing well fluid, comprising:

a thermoelectric cooling system, positioned downhole in the deep well, having a hot plate and a cold plate and having at least one cooling stage, the cold plate serving as a mounting support for the electronic components to be cooled;

a vapor phase heat transfer pipe having lower and upper ends and extending along the axis of the well, the lower end of the pipe being thermally connected to the hot plate of said thermoelectric cooling system;

a vacuum insulated dewar flask, extending along the axis of the well, having a closed lower end and surrounding the thermoelectric cooling system, the electronic components and a major portion of the heat transfer pipe;

a thermal insulator stopper inserted in the open upper end of the dewar flask, the heat transfer pipe extending through the stopper so that an upper minor portion of the pipe is positioned above the stopper and is outside of the enclosure formed by the dewar flask and the stopper;

and heat exchanger means thermally connected to the upper portion of the heat transfer pipe and communicating with the well fluid in order to conduct heat from the pipe to the well fluid and thus to the downhole environment, heat being pumped uphill against the temperature gradient by the thermoelectric cooling system, thereby cooling the electronic components, from a relatively low temperature on the cold plate, which low temperature is substantially less than the high ambient temperature in the downhole environment, to a relatively high temperature on the hot plate, which high temperature is greater than the ambient temperature, heat thereby being transferred by said heat transfer pipe with relatively little temperature loss from the hot plate and from the pipe's lower end to the pipe's upper end, from which upper end said heat exchanger means transfers heat downhill with the temperature gradient to the well fluid and to the downhole environment which are established at the ambient temperature and have an infinite heat capacity, thereby functioning as a heat sink.

2. A downhole thermoelectric refrigerator according to claim 1 wherein said dewar flask has a circular cross-section with an outside diameter which is extremely small compared to the length of said dewar flask.

3. A downhole thermoelectric refrigerator according to claim 2 wherein said stopper extends within said dewar flask from its upper end and down along its axis to a level slightly above said thermoelectric cooling system.

4. A downhole thermoelectric refrigerator according to claim 1 wherein said heat exchanger means includes a plurality of heat conducting fins for transferring heat from the upper end of said heat transfer pipe to the well fluid.

5. A downhole thermoelectric refrigerator according to claim 1 wherein said thermoelectric cooling system includes a plurality of series-connected cooling stages each having a hot side and a cold side, the cold side of one cooling stage being thermally connected to the hot side of the next-occurring cooling stage in the series, the hot side of the first-occurring cooling stage being thermally connected to the hot plate of said cooling system, while the cold side of the last-occurring cooling stage is thermally connected to the cold plate of said cooling system.

6. A downhole thermoelectric refrigerator according to claim 1 wherein said thermoelectric cooling system includes first, second, third and fourth series-connected cooling stages each having a hot side and a cold side, the hot side of said first cooling stage being thermally connected to the hot plate of said cooling system, the cold side of said first cooling stage being thermally connected to the hot side of said second cooling stage, the cold side of said second cooling stage being thermally connected to the hot side of said third cooling stage, the cold side of said third cooling stage being thermally connected to the hot side of said fourth cooling stage, while the cold side of said fourth cooling stage is thermally connected to the cold plate of said cooling system.

* * * * *